United States Patent
Tsai et al.

(10) Patent No.: US 8,404,581 B2
(45) Date of Patent: Mar. 26, 2013

(54) METHOD OF FORMING AN INTERCONNECT OF A SEMICONDUCTOR DEVICE

(75) Inventors: Hsin-Yi Tsai, Hsinchu (TW); Yu-Yu Chen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 114 days.

(21) Appl. No.: 12/569,146

(22) Filed: Sep. 29, 2009

(65) Prior Publication Data

US 2011/0076845 A1    Mar. 31, 2011

(51) Int. Cl.
*H01L 21/4763* (2006.01)
(52) U.S. Cl. ........................................ 438/637
(58) Field of Classification Search .................. 438/637
See application file for complete search history.

(56) References Cited

U.S. PATENT DOCUMENTS

| | | | |
|---|---|---|---|
| 5,614,765 A * | 3/1997 | Avanzino et al. | 257/774 |
| 5,741,741 A * | 4/1998 | Tseng | 438/637 |
| 5,882,996 A * | 3/1999 | Dai | 438/597 |
| 6,127,263 A * | 10/2000 | Parikh | 438/637 |
| 6,140,226 A * | 10/2000 | Grill et al. | 438/637 |
| 6,153,511 A * | 11/2000 | Watatani | 438/623 |
| 6,287,961 B1 * | 9/2001 | Liu et al. | 438/638 |
| 6,326,296 B1 * | 12/2001 | Tsai et al. | 438/624 |
| 6,326,300 B1 * | 12/2001 | Liu et al. | 438/638 |
| 6,472,317 B1 * | 10/2002 | Wang et al. | 438/638 |
| 6,809,027 B2 * | 10/2004 | Strane et al. | 438/637 |
| 7,067,419 B2 * | 6/2006 | Huang et al. | 438/638 |
| 7,354,859 B2 * | 4/2008 | Nagase | 438/687 |
| 7,491,640 B2 * | 2/2009 | Nagase | 438/638 |
| 7,696,085 B2 * | 4/2010 | Li et al. | 438/626 |
| 2001/0002331 A1 * | 5/2001 | Miyata | 438/618 |
| 2002/0076921 A1 * | 6/2002 | Fukada et al. | 438/637 |
| 2003/0197280 A1 * | 10/2003 | Davis et al. | 257/774 |
| 2003/0228752 A1 * | 12/2003 | Strane et al. | 438/637 |
| 2005/0082674 A1 * | 4/2005 | Seta et al. | 257/758 |

OTHER PUBLICATIONS

Riley, Paul "Trilayer Photoresist Definition with High Pressure Plasmas" J. Electrochem. Soc., vol. 134, Issue 8, Aug. 1987 pp. 2076-2077.*

* cited by examiner

*Primary Examiner* — N Drew Richards
*Assistant Examiner* — Grant Withers
(74) *Attorney, Agent, or Firm* — Haynes and Boone, LLP

(57) ABSTRACT

A method for fabricating an integrated circuit device is provided. In one embodiment, the method includes providing a substrate. A first photolithography process is performed to define a first pattern on the substrate. The first pattern includes a first trench segment. A second photolithography process is performed which defines a second pattern on the substrate. The second pattern includes a second trench segment. The second trench segment includes an overlap area with the first trench segment. The embodiment of the method further includes etching the substrate according the first and second patterns; the etching includes forming a via hole defined by the overlap area. The first trench segment, second trench segment, and via hole may be used to form a dual damascene interconnect structure.

16 Claims, 12 Drawing Sheets

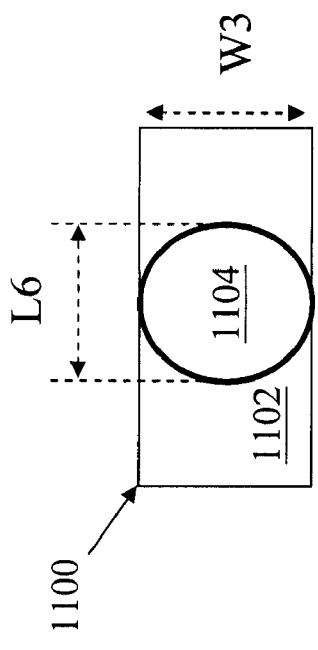
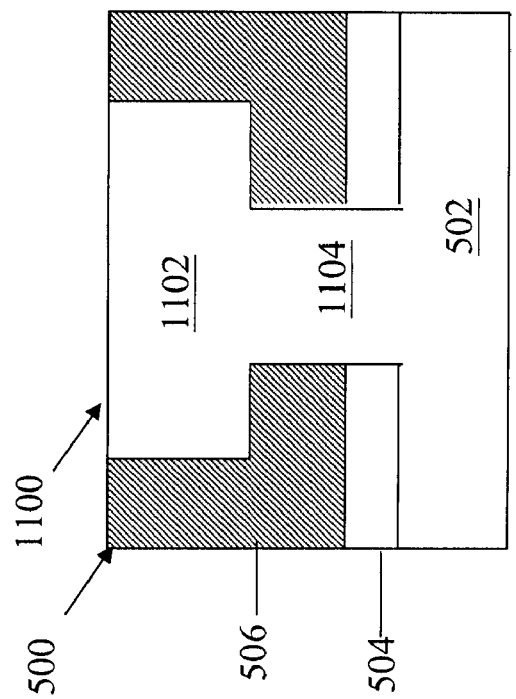
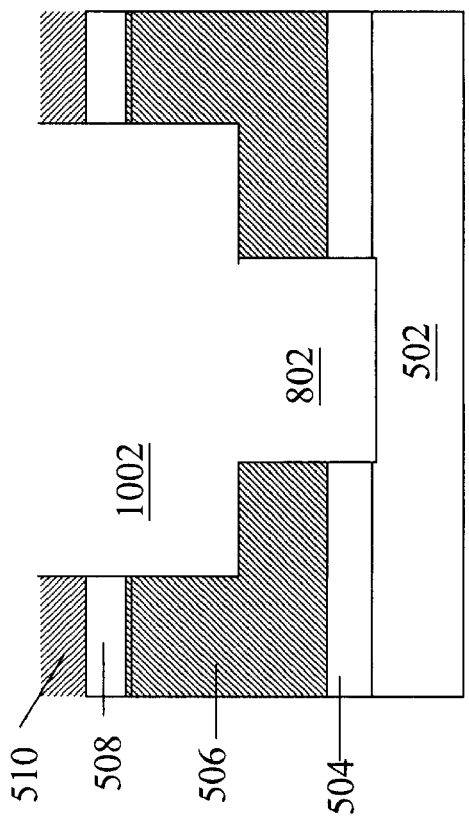
FIG. 11b
FIG. 11a
FIG. 10

METHOD OF FORMING AN INTERCONNECT OF A SEMICONDUCTOR DEVICE

BACKGROUND

The semiconductor integrated circuit (IC) industry has experienced rapid growth. In the course of IC evolution, functional density has generally increased while feature size has decreased. This scaling down process generally provides benefits by increasing production efficiency and lowering associated costs. One method used by the industry to meet the demands for device density is the adoption of damascene and dual-damascene structures for interconnect structures. In a typical damascene process, an underlying insulating layer is patterned with open trenches where the conductor is then deposited and polished to the level of the insulating layer to form a patterned conductor feature. Dual-damascene processes consider a similar approach and generally form and fill two features (a trench and a via) with a single deposition of conductor.

However, as the feature sizes further shrink and density requirements increase, the pitch of features such as interconnect structures decrease. This can cause tension between the overlay specification window and critical dimensions (e.g., of a via of a dual damascene structure). For example, the via size may be such that it is larger than the associated metal feature or trench. This may cause defects that can affect process yields, such as via-induced-metal-bridge (VIMB) or leakage defects. Other tension that can arise with the decreasing feature size and increasing density is the ability to provide a corresponding interconnect pitch. One approach used to facilitate the small pitch is a two-photolithography, two-etch (2P2E) approach which can provide the appropriate lithography depth of focus (DOF). However, the process may be complicated and cost-inducing.

Accordingly, what is needed is a method for fabricating an IC device that addresses one or more of the above stated issues.

SUMMARY

A method for fabricating an integrated circuit device is provided. In one embodiment, the method includes providing a substrate. A first photolithography process is performed to define a first pattern on the substrate. The first pattern includes a first trench segment. A second photolithography process is performed which defines a second pattern on the substrate. The second pattern includes a second trench segment. The second trench segment includes an overlap area with the first trench segment. The embodiment of the method further includes etching the substrate according the first and second patterns; the etching includes forming a via defined by the overlap area.

In one embodiment, the method for fabricating a semiconductor device a substrate is provided. The substrate includes a dielectric layer and a hard mask layer disposed on the dielectric layer. The hard mask layer is patterned to form a masking element defining a first trench segment. Thereafter, a photosensitive layer is patterned to define a second trench segment. The second trench segment includes an overlap area with the first trench segment. The dielectric layer underlying the overlap area is etched to form a via hole. The hard mask layer is etched using the patterned photosensitive layer to form a modified masking element defining the first and second trench segments. The modified masking element is used to etch a trench in the dielectric layer. The trench is coupled to the via hole.

In one embodiment, the method of fabricating an integrated circuit device includes providing a substrate. A first photolithography process is performed which defines a first pattern on the substrate. The first pattern includes a first trench segment and a second trench segment. A masking element is formed which defines the first and second trench segments. A second photolithography process is performed to define a second pattern on the substrate. The second pattern includes a third trench segment and a fourth trench segment. The third trench segment includes an overlap area with the first trench segment and the fourth trench segment includes an overlap area with the second trench segment. A via hole is etched in each of the overlap areas. The masking element is then modified according to the second pattern. The substrate is etched using the modified masking element to define a first and a second dual damascene profile opening. The dual damascene profile opening including the via holes.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 5-11a/b are embodiments of cross-sectional views of a substrate corresponding to one or more steps of the method of FIG. 4.

DETAILED DESCRIPTION

Figure 1:
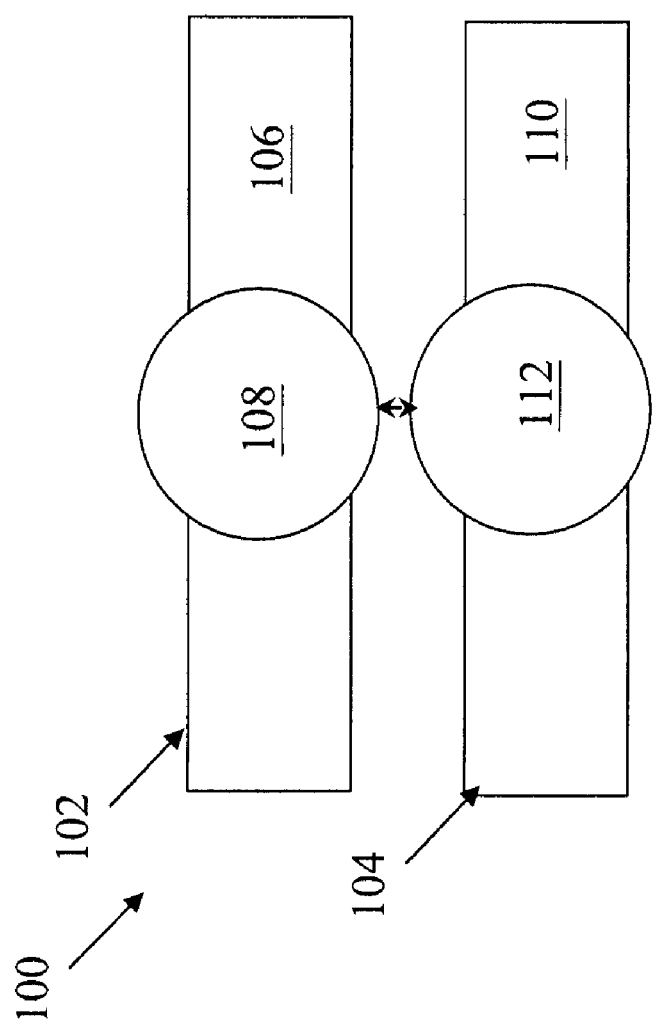
FIG. 1 is a top view of a dual damascene structure according to the prior art.

The present disclosure relates generally to methods for manufacturing integrated circuit devices, and more particularly, to a method of forming interconnect structures such as a dual damascene structure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIG. 1, illustrated is a semiconductor device 100 including a first dual damascene structure 102 and a second dual damascene structure 104. The dual damascene structure 102 includes a trench structure 106 and a via structure 108. The dual damascene structure 104 includes a trench structure 110 and a via structure 112. FIG. 1 illustrates the via structures 104/108 are greater in width than their associated trench structures 106/110.

The semiconductor device 100 may be illustrative of certain disadvantages found in embodiments provided by the prior art. For example, as the technology nodes decrease in pitch, the overlay specification is difficult to meet and the via critical dimension becomes increasingly difficult to decrease due to lithographic limitations (e.g., depth of focus (DOF)). This creates a via size larger than its associated trench which may cause via-induced-metal-bridge (VIMB) defects and/or via-to-via leakage defects. In addition, embodiments of the prior art negatively affect the time dependent dielectric breakdown (TDDB) of the device.

Figure 2:
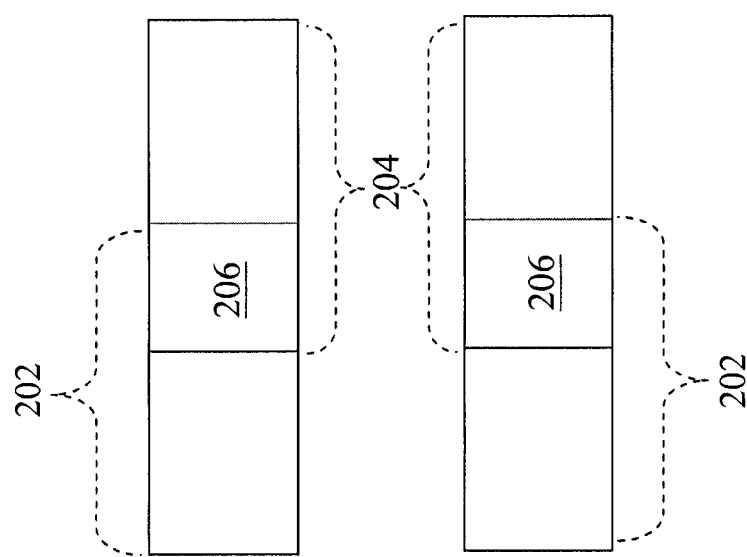
FIG. 2 is a top view illustrating an embodiment of a dual damascene pattern according to the present disclosure.

Referring now to FIG. 2, illustrated is a plurality of patterns that may be used to form a portion of a semiconductor device. The patterns may be provided in a photomask or by other lithography technique. In an embodiment, the patterns of FIG. 2 define dual-damascene structures. A first pattern 202 defines a first portion of a trench. A second pattern 204 defines a second portion of a trench. The first and second portions may be of the same trench. The overlap area 206 (also referred to herein as the stitched-area) defines a via hole associated with the trench. The first pattern 202 and the second pattern 204 are associated with the same interconnect layer or level of multi-layer interconnect structure (e.g., metal one, metal two, etc).

Figure 3:
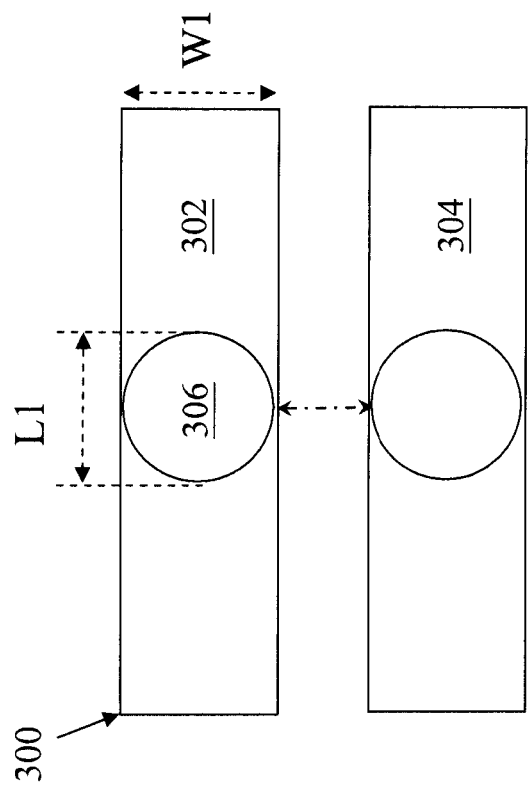
FIG. 3 is a top view illustrating an embodiment of a dual damascene structure according to the present disclosure.

FIG. 3 illustrates a top-view of an interconnect structure 300 formed using the embodiment of FIG. 2. The interconnect structure 300 is a dual-damascene interconnect structure. FIG. 3 includes a first trench 302 and a second trench 304. The first trench 302 and second trench 304 may be included on the same level of a multi-layer interconnect structure. The first trench 302 and second trench 304 may be conductive lines. A via 306 is associated with each trench. In an exemplary embodiment, the first trench 302 is formed by the combination of patterns 202 and 204 and the via 306 is defined by the overlap portion 206 described above with reference to FIG. 2. Likewise, in an exemplary embodiment, the second trench 304, which may provide a distinct interconnect structure (e.g., dual damascene structure) is formed by the combination of patterns 202 and 204 and the via 306 is defined by the overlap portion 206 described above with reference to FIG. 2. The via 306 is constrained in width (W1) by the width of the respective conductive line 302/304. The via 306 is defined in length (L1) by the length overlap portion 206, or the amount of overlap of the patterns 202 and 204. Thus, FIG. 3 illustrates an embodiment that may provide one or more advantages over the prior art. For example, an embodiment of the interconnect structure 300 may reduce VIMB or leakage defects as the vias 306 are constrained within the conductive lines.

Figure 4:
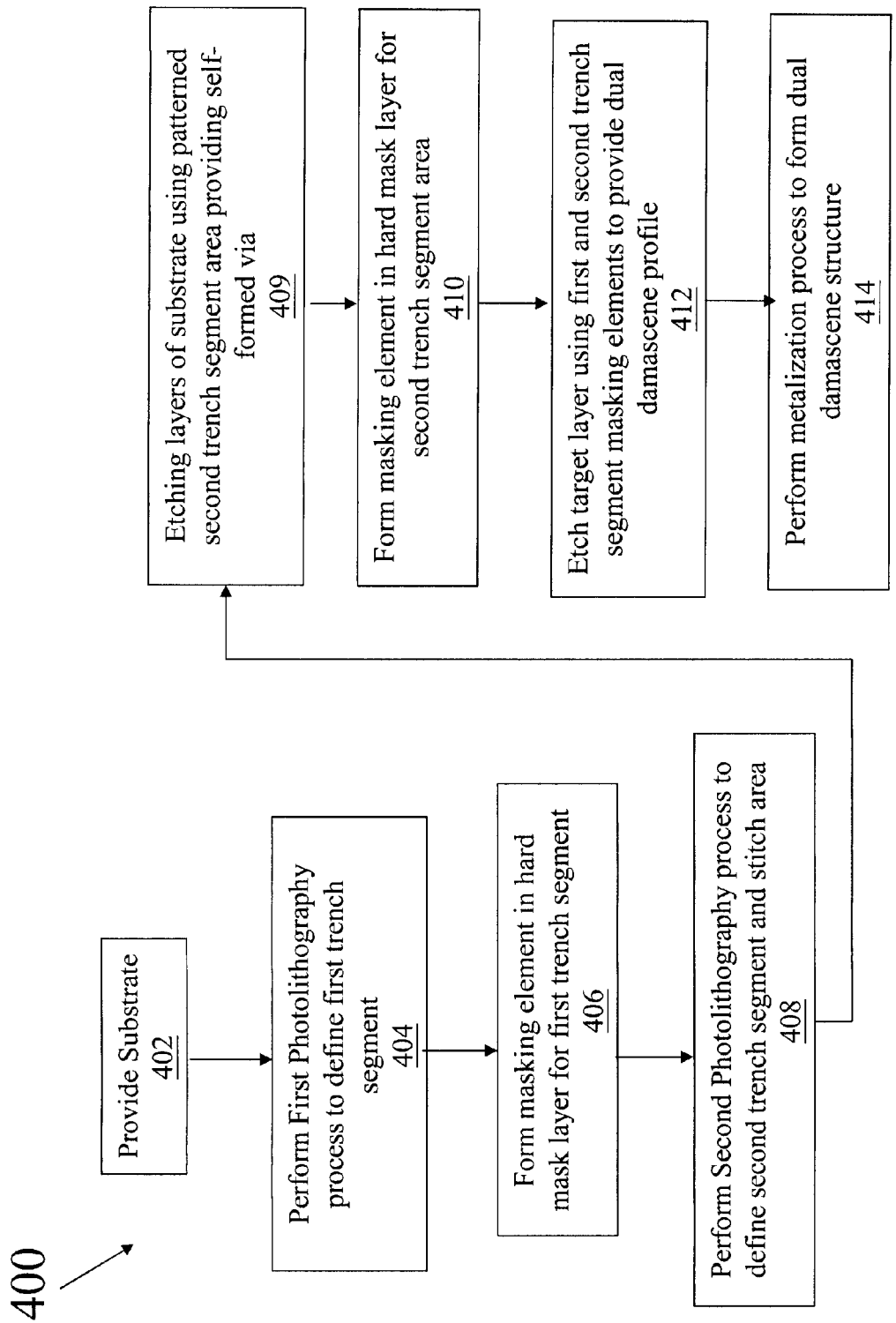
FIG. 4 is a flow chart illustrating an embodiment of a method of forming a dual damascene structure.

Referring now to FIG. 4, illustrated is a method 400 of forming a dual damascene interconnect structure of a semiconductor device. FIGS. 5-11a/b illustrate exemplary embodiments, shown in cross-sectional views in portion or in entirety, corresponding to one or more steps of the method 400. The semiconductor device may include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors; other suitable components; and/or combinations thereof. It is understood that additional steps can be provided before, during, and after the method 400, and some of the steps described below can be replaced or eliminated, for additional embodiments of the method.

Figure 5:
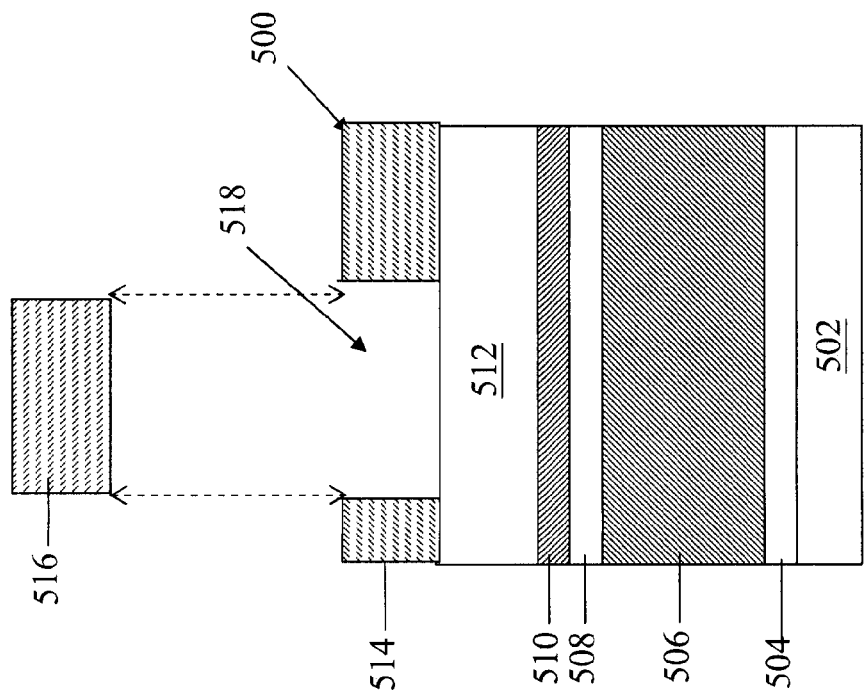

The method 400 begins at block 402 where a substrate is provided. In the example of FIG. 5, a semiconductor device 500 including a substrate 502 is provided. The substrate 502 may include an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; combinations thereof; or other suitable substrate materials. In embodiments, the substrate 502 may be a semiconductor on insulator (SOI) substrate, a strained substrate, and/or include other features known in the art. The semiconductor substrate 502 includes a plurality features or layers formed thereon, including, for example, doped regions, active devices (e.g., gate structures), isolation regions, interconnect structures (e.g., metal lines, vias, contacts), and like features. It is understood that the substrate 502 may include features formed using CMOS technology processing known in the art, and thus processes are not described in detail herein.

FIG. 5 further illustrates a plurality of layers formed on the substrate 502: an etch stop layer 504, a target layer 506 (in an embodiment, as discussed herein, the target layer 506 includes a dielectric layer), a capping layer 508, a hard mask layer 510, an anti-reflective coating (ARC) layer 512, and a photosensitive layer 514. In embodiments, one or more of these layers may be omitted, additional layers may be provided; and the layers may be provided in a different sequence. The etch stop layer 504 may include SiC, SiOC, SiN, SiON, SiCN, and/or other suitable materials. The target layer 506 may be an interlayer dielectric layer (ILD). The target layer 506 may include any suitable dielectric material including TEOS oxide, silicon oxide, silicon nitride, silicon oxynitride, hafnium oxide, zirconium oxide, titanium oxide, aluminum oxide, hafnium dioxide-alumina ($HfO_2$—$Al_2O_3$) alloy, PSG, BPSG, other suitable dielectric materials, and/or combinations thereof. The dielectric layer 506 may comprise a low-k dielectric material, such as fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper porous polymeric materials, and/or combinations thereof. The dielectric layer 506 is formed by any suitable process to any suitable thickness, including by chemical vapor deposition (CVD), high density plasma CVD, spin-on, sputtering, and/or other suitable methods. The dielectric layer 506 may further include a multilayer structure comprising multiple dielectric materials, including, for example, the capping layer 508. The hard mask layer 510 may include silicon nitride, silicon oxynitride, silicon carbide, and/or other suitable materials, and may be formed using any suitable method, such as CVD, PVD, or sputtering. The hard mask layer 510 and/or the dielectric layer 506 compositions may be selected based on the etch selectivity between the compositions. As described in greater detail below, the self-formation of a via hole may depend on the selectivity of the hard mask 510 to dielectric layer 506.

The ARC layer 512 may provide a bottom ARC layer (BARC) layer. Example compositions for the ARC layer 512 include organic or inorganic polymer compositions. Examples of the photosensitive layer 514 include typical photoresist compositions such as chemical amplification resist (CAR) material. The photosensitive layer may include photo-acid generator (PAG) material, a polymer material soluble to a developer when reacted with acid, a solvent, and/or other suitable materials.

The method 400 then proceeds to block 404 where a first photolithography process is performed to define a first trench segment (e.g., portion). In the example of FIG. 5, a plane view of a pattern 516 is illustrated. The pattern 516 may be provided a photomask or other lithography device. The pattern 516 may be defined in the photosensitive layer 514 using typical photolithography processes. Such processing may include exposure, development, baking processes, rinsing and drying processes, and the like. The photolithography exposing process may also be implemented or replaced by other proper methods such as maskless photolithography, electron-beam writing, and ion-beam writing. The pattern 516 defines a first trench portion 518 in the photosensitive layer 514. In an embodiment, the pattern 516 is substantially similar to the pattern 202, described above with reference to FIG. 2.

Figure 6:
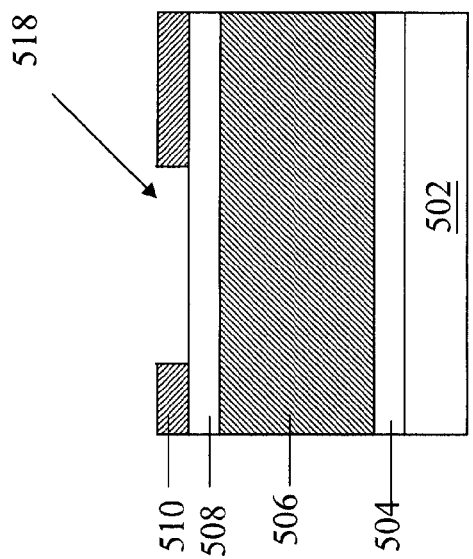

The method 400 then continues to block 406 where a masking element associated with (e.g., defining) the first trench segment is formed. As used herein, a masking element may include any layer or layers used to define a pattern in an underlying layer or layers. In the example of FIG. 6, first trench portion 518 defined in the photosensitive layer 514 (see FIG. 5) is used to form a masking element defining the first trench portion 518 in the hard mask layer 510. The opening in the hard mask layer 510 defined by the pattern 516—the first trench segment. Specifically, the patterned photosensitive layer 514 may be used to transfer the pattern using an etching process (e.g., dry etching) to an underlying layer, in the illustrated embodiment, the hard mask layer 510. Thereafter, the photosensitive layer 514 and/or the ARC layer 512 may be removed, for example, using stripping or ashing processes. Other embodiments of patterning and/or providing an masking element are possible.

The method 400 then proceeds to block 408 where a second photolithography process is performed to define a second trench segment. The second photolithography process may include steps substantially similar to those described above with reference to block 404. Block 408, by defining the second trench segment area, also defines an overlap segment (or stitch area). The overlap segment includes an area of the substrate that is covered by both the first and second photolithography process, or a pattern produced by the overlapping of the first trench segment pattern and the second trench pattern. The first trench segment and the second trench segment (e.g., block 404 and block 408) may each provide a portion of a interconnect structure, for example, a portion of a dual damascene structure.

Figure 7:
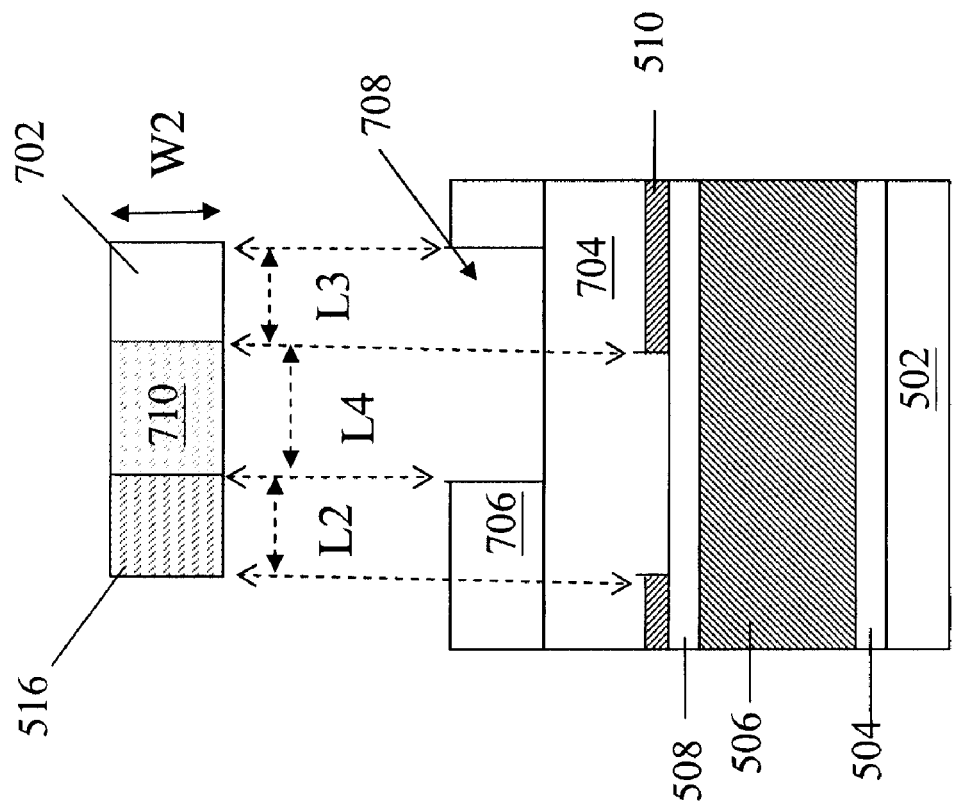
Figures 8, 9:
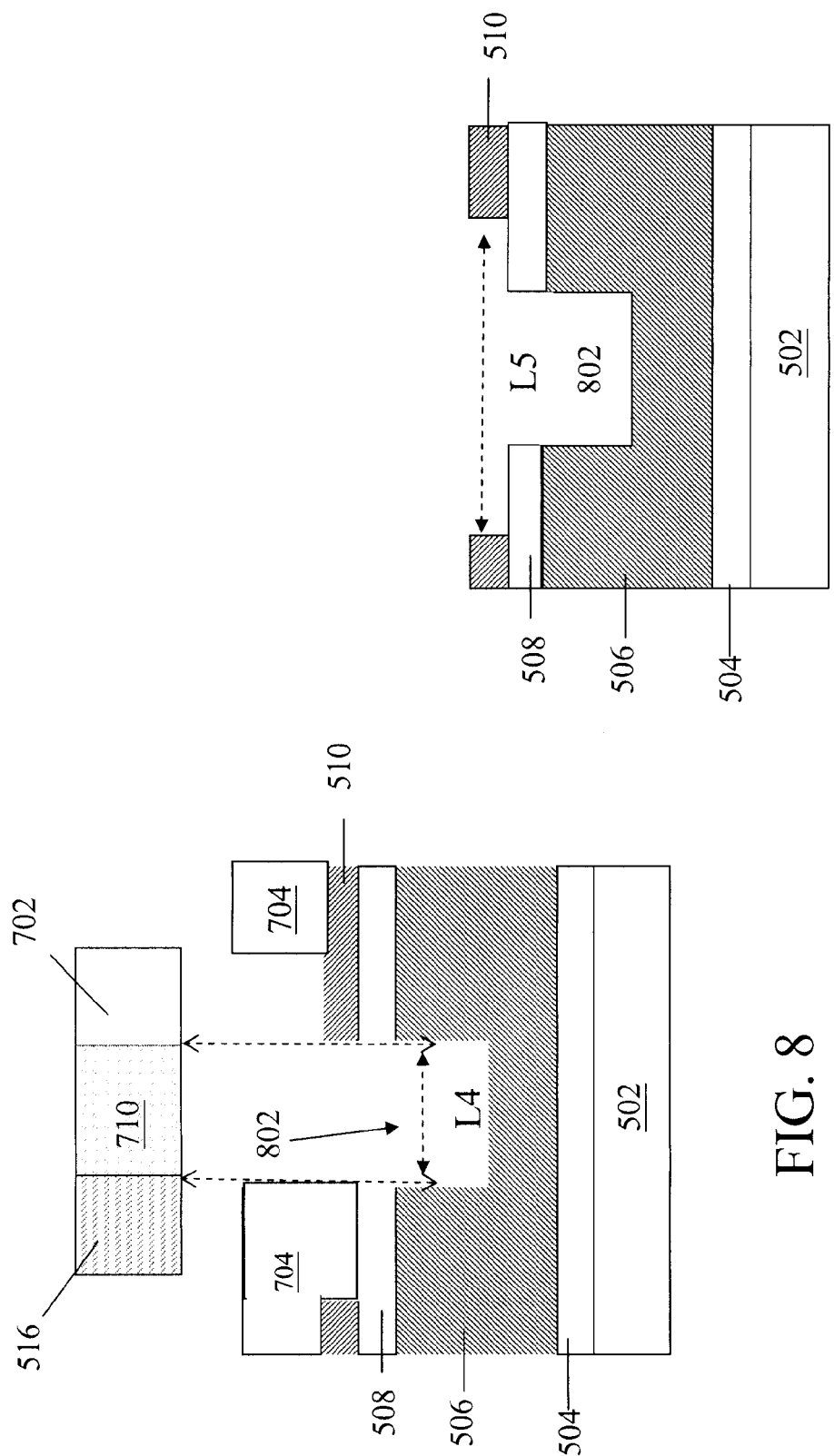

Referring to the example of FIG. 7, a plane view of a pattern 702 provided by a second lithography process is illustrated. The pattern 702 may be provided in a photomask or by other lithography device. The pattern 702 defines a second trench segment. The pattern 702 also defines, in conjunction with the pattern 516, and overlap portion 710. The length of the pattern 516 (associated with the first trench segment) is L2+L4. The length of the pattern 702 (associated with the second trench segment) is L3+L4. The overlap portion 710 has a length L4. Though illustrated together, the pattern 516 is provided for ease of reference, and the pattern 702 may be provided in a second lithography process, while the pattern 516 is provided in a previous lithography process and not included in the second lithography process.

In the illustrated embodiment, an ARC layer (e.g., BARC) 704 and a photosensitive layer 706 are formed on the substrate 502. The BARC layer 704 and photosensitive layer 706 may be substantially similar to those discussed above with reference to FIG. 5. The pattern 702 may be formed in the photosensitive layer 706 using typical photolithography processes. Such processing may include exposure, development, baking processes, drying processes, and the like. The pattern 702 forms a second trench portion 708 in the photosensitive layer 706. In an embodiment, the pattern 702 is substantially similar to the pattern 204, described above with reference to FIG. 2. The overlap of the pattern 702 and the pattern 516, illustrated as overlap portion 710, defines an overlap region or stitch area. The pattern 710 defines a via dimension(s). For example, the length L4 of the overlap portion 710 defines the length of the resultant via structure. The width W2 of the pattern 516 and/or pattern 702 defines the width of the resultant via structure and/or the width of the overlap portion 710.

The method 400 then proceeds to block 409 where the pattern defining the second trench structure is transferred to one or more layers of the substrate. The pattern may be transferred to one or more layers using an etch process such as, dry etching. In an embodiment, the pattern is transferred to an underlying BARC layer, however, numerous other embodiments are possible. While transferring the pattern of the second trench segment to an underlying layer, a via hole may be self-formed in the overlap area. For example, as the hard mark layer has been opened (e.g., removed) on account of the first trench pattern, that portion of the substrate will be unprotected and simultaneously etched as a layer(s) is patterned to define the second trench segment. Thus, a via hole may be self-formed in an underlying layer (e.g., dielectric layer), which is unprotected. Referring to the example of FIG. 8, the photosensitive layer 706 (FIG. 7) is used (as a masking element to pattern) to pattern the BARC layer 704. While patterning (e.g., etching) the BARC layer 704, a via hole 802 is formed. The dielectric layer 506 and the capping layer 508 are etched providing the via hole 802. Specifically, the dielectric layer 506 and the capping layer 508 are etched in the area where the hard mask 510 has been removed (e.g., as provided in block 406 and illustrated in FIG. 6). Because of the selectivity of the hard mask layer 510 to the dielectric layer 506, the hard mask layer 510 remains disposed on the substrate 502 while the dielectric layer 506, or portion thereof, is removed. The depth of the via hole 802 may be determined by an etch time endpoint. Thus the via hole 802 is a self-formed via hole as it is formed during the patterning of the BARC layer 704. The via hole 802 is defined by the overlap area 710. The patterns 516, 702, and 710 are illustrated for reference purposes and do not imply nor necessitate performance of a lithography or exposure process in FIG. 8 or block 409.

The method 400 then proceeds to block 410 where a masking element is formed using the second trench segment pattern. Referring to the example of FIG. 9, the hard mask layer 510 is patterned according to the pattern 702, e.g., by transferring the pattern from the BARC layer 704. Thus, the hard mask layer 510 then provides a masking element defined by both the first photolithography process/pattern (e.g., first trench segment) and the second photolithography process/pattern (e.g., second trench segment). The hard mask layer 510 has been patterned to provide a trench comprising both the first trench segment and the second trench segment. For example, the trench provides a length L5 approximately equal to L2+L4+L3). This process may also be described herein as a hard mask opening process. The via hole 802 remains during the opening of the hard mask. Depending on the etch selectivity of the hard mask layer 510 and the dielectric layer 506, the depth of the via hole 802 may remain substantially constant through the hard mask opening process. However, other embodiments are possible. It is noted that the photosensitive layer(s) and/or BARC layer 704 may be removed using a suitable process such as an ashing process.

The method 400 then proceeds to block 412 where the target layer (e.g., dielectric layer) is etched using the formed masking element to provide a dual damascene trench profile (e.g., opening). Referring to the example of FIG. 10, the patterned hard mask layer 510 is used as a masking element to remove portions of the dielectric layer 506 (and capping layer 508) to form a trench opening 1002. The via hole 802 may be extended in depth from the self-forming process of block 409. The trench opening 1002 and via hole 802 together are referred to as a dual damascene profile. The via hole 802 depth may be determined by the position of the ESL 504.

The method 400 then proceeds to block 414 where a metallization process is used to form a dual damascene structure. The dual damascene profile may be filled with conductive material. The deposition processes may include chemical vapor deposition (CVD), physical vapor deposition (PVD), atomic layer deposition (ALD), high density plasma CVD (HDPCVD), metal organic CVD (MOCVD), remote plasma CVD (RPCVD); plasma enhanced CVD (PECVD), plating, other suitable methods, and/or combinations thereof. The conductive material may be provided in one or more layers of one or more compositions, including, for example, barrier or liner layers. In an embodiment, a chemical mechanical polish process (CMP) planarizes the structure with a top surface of the dielectric layer. Referring to the example of FIGS. 11*a* and 11*b*, the dual damascene structure 1100 is formed. The dual damascene structure 110 includes a conductive trench 1102 and a conductive via 1104. The conductive trench 1102 is formed from the trench 1002. The conductive via 1104 is formed from the via hole 802. The dual damascene structure 1100 is coupled to the substrate 502. In an embodiment, the dual damascene structure 1100 is coupled to a conductive feature such as a contact, a interconnect line, or similar feature. FIG. 11*b* illustrates a top view of the dual damascene structure 1100. The dual damascene structure 1100 may be substantially similar to the interconnect structure 300, described above with reference to FIG. 3. The via 1104 includes a length L6 that is substantially equal to the length L1 defined by the overlap area 710. Similar to as described above with reference to FIG. 3, the via 1104 width W3 is constrained by the width of the trench 1102. W3 may be substantially equal to W2.

As the technology nodes decrease, the interconnect pitch size decreases. In order to provide a suitable process under the constraints of the current lithography processes (e.g., DOF constraints), specialized processes have been implemented. Such processes are typically complicated and higher in cost. One approach uses multiple photolithography and etching steps to provide a small pitch (e.g., <80 nm) interconnect structure. For example, a first photolithography process defines a first trench, a hard mask opening process provides a masking element for the first trench, a second photolithography process defines a second trench adjacent the first trench, and the hard mask is again etched to provide an opening for a masking element of the second trench. Similar processes are required to form a via associated each trench. For example, a first via photolithography step defines the first via, a first via etch is performed, a second via photolithography step is performed to define the second via (associated with the second trench), and the second via etch is performed. This may be described as a trench-first two-photo-two-etch (2P2E) process. However, typical processes implementing similar approaches often are challenged by issues similar to those illustrated and described above with reference to FIG. 1.

Figure 12:
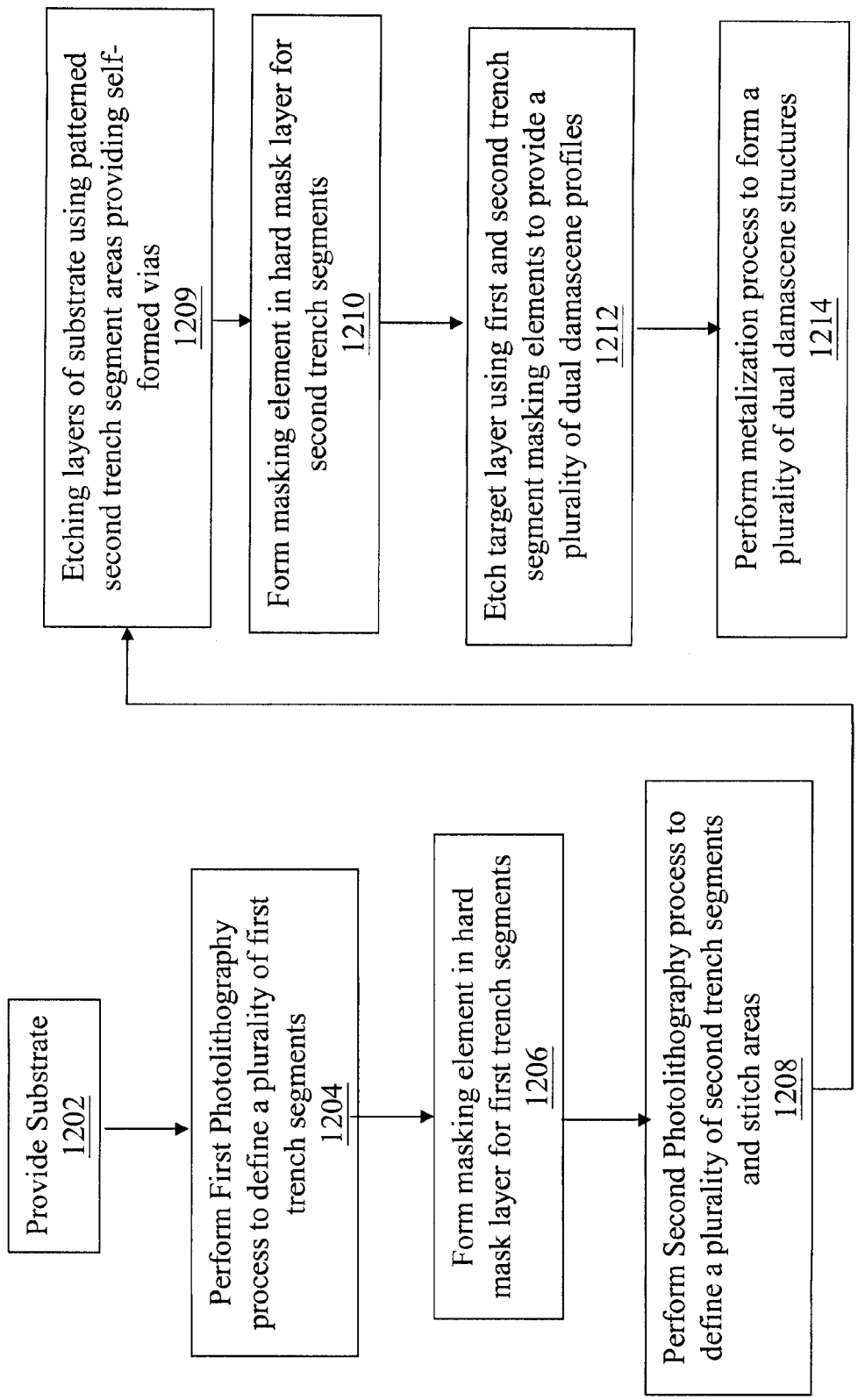
FIG. 12 is an alternative embodiment of a method of forming a dual damascene structure.

Referring now to FIG. 12, illustrated is a method 1200 of forming dual damascene interconnect structures of a semiconductor device or integrated circuit. The method 1200 may be useful in forming smaller pitch interconnect structures. In an embodiment, the method 1200 maybe implemented in process technology nodes of 22 nm or below. FIGS. 15-19*a/b* illustrate exemplary embodiments, shown in cross-sectional views in portion or in entirety, corresponding to one or more steps of the method 1200. The semiconductor device may include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors; other suitable components; and/or combinations thereof. It is understood that additional steps can be provided before, during, and after the method 1200, and some of the steps described below can be replaced or eliminated, for additional embodiments of the method.

Figure 13:
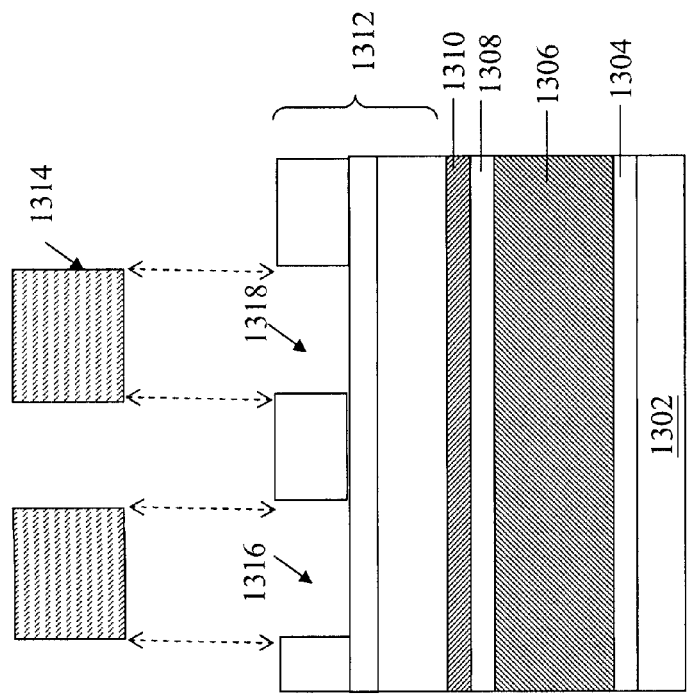

The method 1200 begins at block 1202 where a substrate is provided. In the example of FIG. 13, a substrate 1302 is provided. The substrate 1302 may be substantially similar to the substrate 502, described above with reference to FIG. 5. FIG. 13 further illustrates a plurality of layers formed on the substrate 1302: an etch stop layer 1304, a target layer 1306 (e.g., a dielectric layer), a capping layer 1308, a hard mask layer 1310, and a tri-layer photoresist stack 1312. In embodiments, one or more of these layers may be omitted, additional layers may be provided; and the layers may be provided in a different sequence. The etch stop layer 1304 may be substantially similar to the ESL 504, described above with reference to FIG. 5. The target layer 1306 may be an interlayer dielectric layer (ILD). The target layer 1306 may be substantially similar to the dielectric layer 506 described above with reference to FIG. 5. The target layer 1306 may also include a multilayer structure comprising multiple dielectric materials, including, for example, the capping layer 1308. The hard mask layer 1310 may be substantially similar to the hard mask layer 510, also described above with reference to FIG. 5.

The hard mask layer 1310 and/or the target layer 1306 compositions may be selected based on the etch selectivity between the compositions. As described in greater detail below, a via hole may be self-formed using the etch-selectivity of the hard mask 1310 to target layer 1306. Example compositions of one or more layers of the tri-layer photoresist stack 1312 may be substantially similar to the photosensitive layer 514 and/or the ARC layer 512, spin-on-glass, and/or other suitable materials. In other embodiments, the tri-layer photoresist 1312 may be any other number of layers or a single layer of photosensitive material.

The method 1200 then proceeds to block 1204 where a first photolithography process is performed to define a plurality of trench segments (e.g., portion). The plurality of trench segments formed may provide a portion of each of a plurality of interconnect structures. In the example of FIG. 13, a plane view of a pattern 1314 is illustrated. The pattern 1314 may be provided in a photomask or other suitable lithography device. The pattern 1314 may be defined in the upper layer of the tri-layer photoresist 1312 using typical photolithography processes. Such processing may include exposure, development, baking processes, rinsing and drying processes, and the like.

The photolithography exposing process may also be implemented or replaced by other proper methods such as maskless photolithography, electron-beam writing, and ion-beam writing. The pattern 1314 defines a trench portion 1316 associated with a first interconnect structure and a trench portion 1318 associated with a second interconnect structure in the tri-layer photoresist 1312. In an embodiment, the pattern 1314, or portion thereof, is substantially similar to the pattern 202, described above with reference to FIG. 2.

Figure 14:
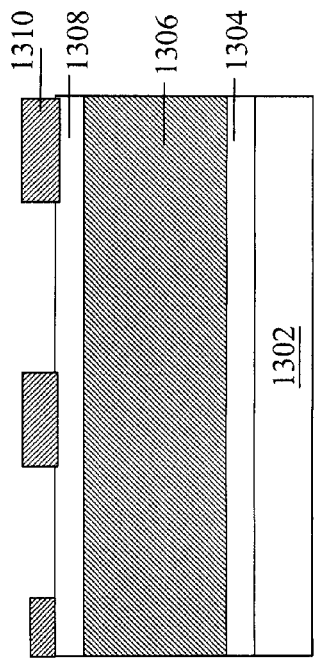
FIGS. 13-19a/b are cross-sectional views illustrating embodiments of a substrate corresponding to one or more steps of the method of FIG. 12.

The method 1200 then continues to block 1206 where a masking element associated with (e.g., defining) the trench segments of block 1204 is formed. In the example of FIG. 14, trench portion 1316 and trench portion 1318 provided in the tri-layer photoresist 1312 are used to form a masking element of the hard mask layer 1310. The patterned tri-layer photoresist 1312 may be used to transfer the pattern to an underlying layer (the hard mask layer 1310) using an etching process (e.g., dry etching). The opening in the hard mask layer 1310, or the masking element of hard mask layer 1310, is defined by the pattern 1314. Thereafter, the tri-layer photoresist 1312 may be removed, for example, using stripping or ashing processes.

The method 1200 then proceeds to block 1208 where a second photolithography process is performed to define a second plurality of trench segments. The second photolithography process may include steps substantially similar to those described above with reference to block 1204. The second plurality of trench segments may define a segment for each of a plurality of interconnect structures. The photolithography process of block 1208 also defines an overlap segment (or stitch area). The overlap segment is the portion of the pattern provided by the second photolithography process that overlaps with the pattern (trenches) defined by the photolithography process of block 1204. Thus, the overlap segment includes an area of the substrate that is covered by both the first and second photolithography process (blocks 1204 and 1208), or a pattern produced by the overlapping of a first trench segment pattern and a second trench segment pattern. The overlap segment may be defined for a plurality of interconnect structures.

Figure 15:
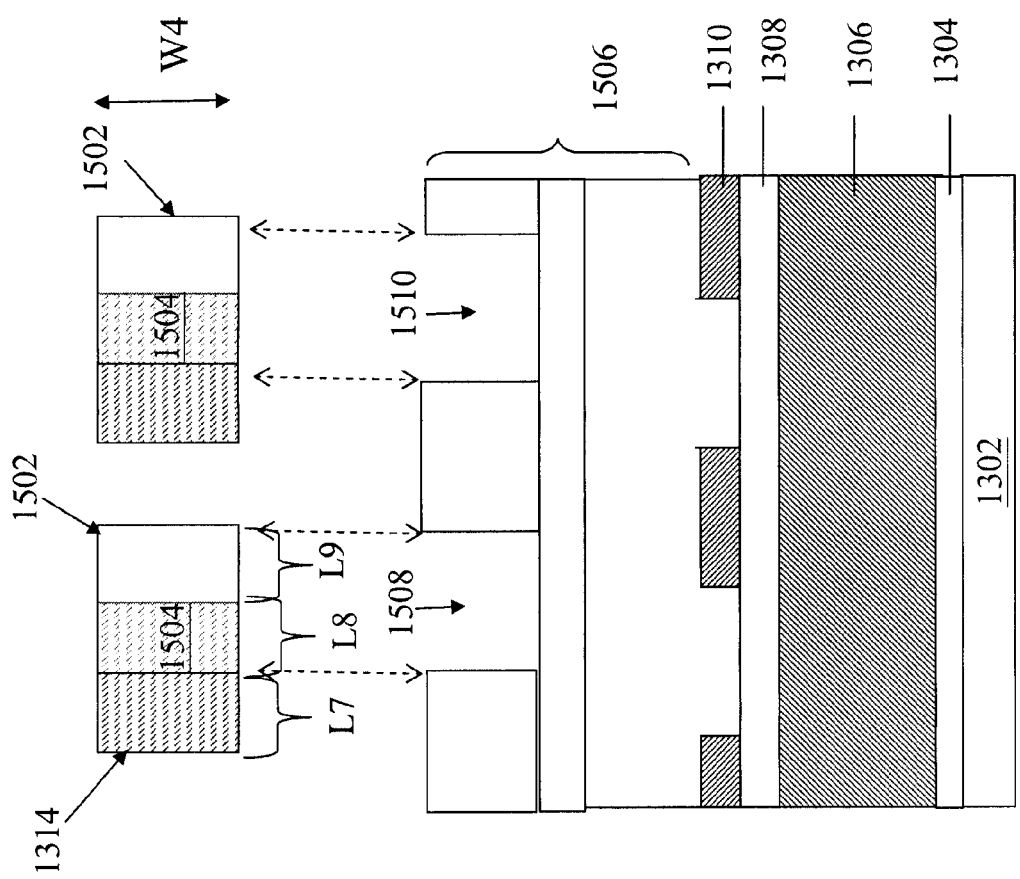
Figure 17:
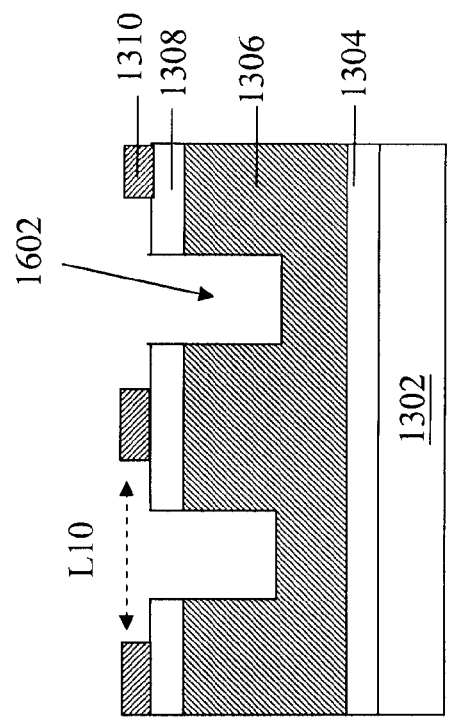
Figure 16:
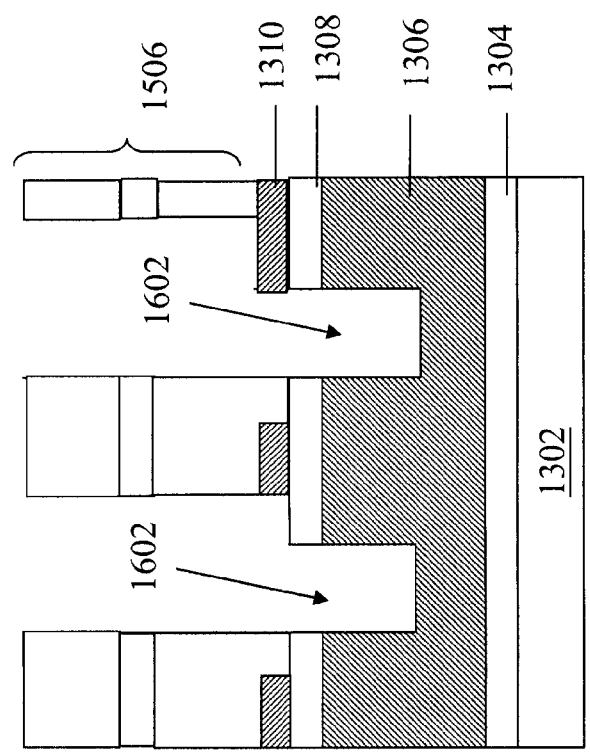

Referring to the example of FIG. 15, a plane view of a pattern 1502 provided by a second lithography process is illustrated. The pattern 1502 may be provided by a photomask or other suitable lithography device. The pattern 1502 defines a second trench segment associated with each of a first and second interconnect structure (or any plurality of structures). The pattern 1502 also defines, in conjunction with the pattern 1314, an overlap area 1504 for each of a first and second interconnect structures (or any plurality of structures). The length of the pattern 1314 associated with a first trench segment is L7+L8 (see block 1204 and FIG. 13). The length of the pattern 1502 associated with the second trench segment is L9+L8. The overlap area 1504 (e.g., stitch area) has a length L8. Though illustrated together, the pattern 1314 is provided for ease of reference, and the pattern 1502 may be provided in a second lithography process, while the pattern 1314 is provided in a previous lithography process and not included in the second lithography process.

In the illustrated embodiment, a tri-layer photoresist 1506 is formed on the substrate 1302. The tri-layer photoresist 1506 may be substantially similar to that discussed above with reference to FIG. 13. The pattern 1502 may be formed in the tri-layer photoresist 1506 using typical photolithography processes. Such processing may include exposure, development, baking processes, drying processes, and the like. The pattern 1502 forms second trench portions 1508 and 1510 in the tri-layer photoresist 1506. The trench portion 1508 may be included in a first interconnect structure; the trench portion 1510 may be included in a second, adjacent, interconnect structure. In an embodiment, the pattern 1502, or portion thereof, is substantially similar to the pattern 204, described above with reference to FIG. 2. The overlap of the pattern 1502 and the pattern 1314, illustrated as overlap portion 1504, defines an overlap region or stitch area. The overlap 1504 defines a resulting via hole dimension(s) as described below. The width W4 of the pattern 1314 and/or pattern 1502 (which may be substantially similar) define the width of the resultant via structure.

The method 1200 then proceeds to block 1209 where the pattern defining the second trench portions is transferred to one or more layers of the substrate. The pattern may be transferred to one or more layers using an etch process such as, dry etching. In an embodiment, the pattern is transferred to an one or more underlying layers of the tri-layer photoresist, however, numerous other embodiments are possible. While transferring the pattern of the second trench segments (defined by block 1208) to an underlying layer, a via hole may be self-formed in the overlap area. For example, as a hard mark layer has been opened (e.g., removed) on account of the first trench pattern (block 1206), that portion of the substrate will be unprotected and thus, may be simultaneously etched. Therefore, a via hole may be formed in an underlying layer (e.g., dielectric layer), which is unprotected. Referring to the example of FIG. 16, the upper layer of the tri-layer photoresist 1506 (see FIG. 15) is used as a masking element to pattern the underlying layers of the tri-layer photoresist 1506. While patterning (etching) the tri-layer photoresist 1506, a via hole 1602 is formed—the target layer 1306 and the capping layer 1308 are etched providing the via hole 1602. Specifically, the dielectric layer 1306 and the capping layer 1308 are etched in the area where the hard mask 1310 has been removed (e.g., as provided in block 1206 and illustrated in FIG. 12). Because of the selectivity of the hard mask layer 1310 to the target layer 1306, the hard mask layer 1310 remains formed on the substrate 1302 while the target layer 1306, or portion thereof, is removed. The depth of the via hole 1302 may be determined by an etch time endpoint. Thus, the via hole 1602 is a self-formed via hole as it is formed during the patterning of the tri-layer photoresist layer 1506 without a distinct process step. The via hole 1602 is defined by the overlap area 1504, described above with reference to FIG. 15.

The method 1200 then proceeds to block 1210 where a masking element is formed using the second trench segments pattern. Referring to the example of FIG. 17, the hard mask layer 1310 is patterned according to the pattern 1502, e.g., by transferring the pattern from the tri-layer photoresist layer 1506. The patterned hard mask layer 1310 provides a masking element defined by both the first photolithography process/pattern (e.g., first trench segments) and the second photolithography process/pattern (e.g., second trench segments). The hard mask layer 1310 has been patterned to provide a plurality of trenches where each trench has a width that is cumulative of both the first trench segment and the second trench segment (e.g., L10 is approximately equal to L7+L8+L9). This process may also be described herein as a hard mask opening process. The via hole 1602 remains during the opening of the hard mask. Depending on the etch selectivity of the hard mask layer 1310 and the dielectric layer 1306, the depth of the via hole 1602 may remain substantially constant through the hard mask opening process. However, other embodiments are possible. It is noted that the photoresist layer(s) may be removed using a suitable process such as an ashing process.

The method 1200 then proceeds to block 1212 where the target layer (e.g., dielectric layer) is etched using the formed masking element to provide a plurality of dual damascene trench profile openings. Referring to the example of FIG. 18, the patterned hard mask layer 1310 is used as a masking element to open the target layer 1306 (and capping layer 1308) to form a trench opening 1802. The via hole 1602 may be extended in depth. The trench opening 1802 and via hole 1602 together are referred to as a dual damascene profile 1800. The via hole 1602 depth may be determined by the position of the ESL 1304.

Figure 19A:
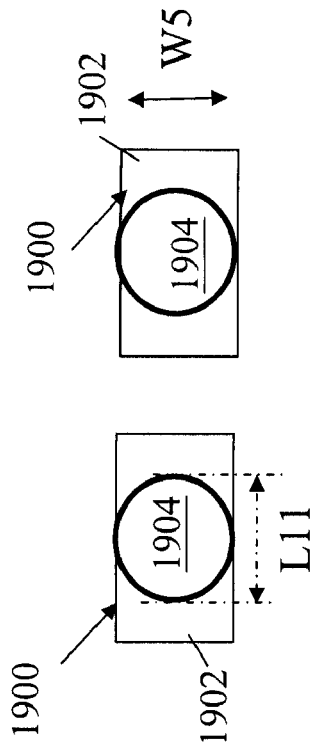
Figure 19B:
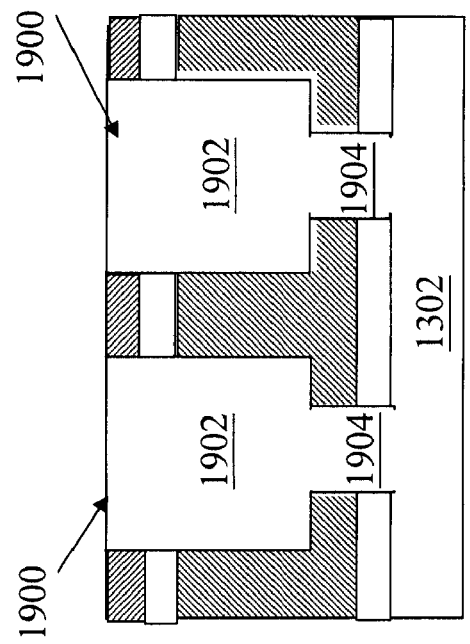
Figure 18:
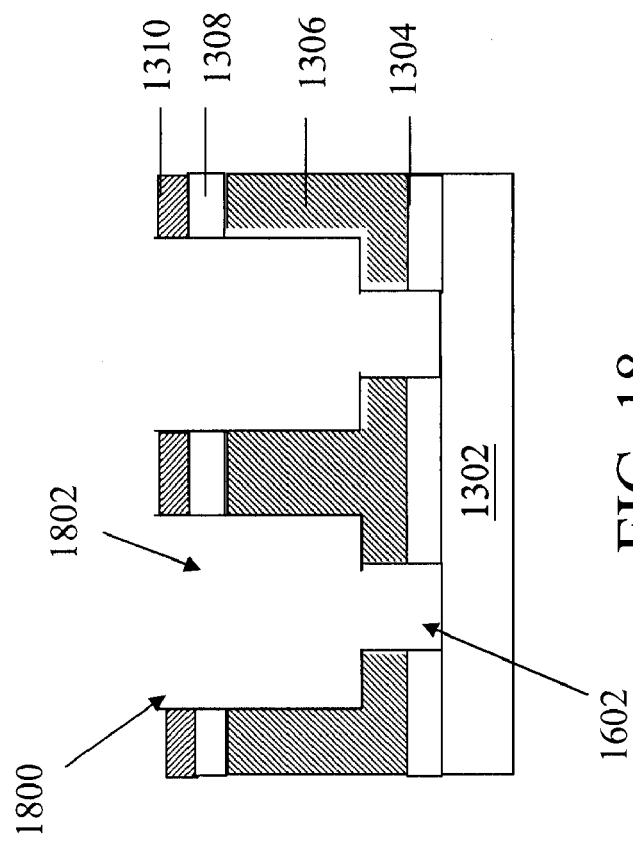

The method 1200 then proceeds to block 1214 where a metallization process is used to form a dual damascene structure. The dual damascene profile opening may be filled with conductive material. The deposition processes may include chemical vapor deposition (CVD), physical vapor deposition (PVD), atomic layer deposition (ALD), high density plasma CVD (HDPCVD), metal organic CVD (MOCVD), remote plasma CVD (RPCVD); plasma enhanced CVD (PECVD), plating, other suitable methods, and/or combinations thereof. The conductive material may be provided in one or more layers of one or more compositions, including, for example, barrier or liner layers. In an embodiment, a chemical mechanical polish process (CMP) planarizes the structure with a top surface of the dielectric layer. Referring to the example, of FIG. 19, the dual damascene structure 1900 is formed including the conductive trench 1902 and the conductive via 1904. The conductive trench 1902 is formed from the deposition of conductive material in the trench 1802; the via 1904 is formed from the deposition of conductive material in the via hole 1602, described above. The dual damascene structure 1900 is coupled to the substrate 1302. In an embodiment, the dual damascene structure 1900 is coupled to a conductive feature such as a contact, a interconnect line (metal line), or similar feature. FIG. 19b illustrates a top view of the dual damascene structure 1900. The dual damascene structure 1900 may be substantially similar to the interconnect structure 300, described above with reference to FIG. 3. The via 1904 includes a length L11 that is substantially equal to the length L8 defined by the overlap area 1504. Similar to as described above with reference to FIG. 3, the via 1904 width W5 is constrained by the width of the trench 1902. The dual damascene interconnect structures 1900 may be adjacent interconnect structures of a semiconductor device. In an embodiment, the pitch of the dual damascene interconnect structures 1900 may be approximately 80 nm or less.

One or more embodiments described herein may provide advantages such as reduction of via-induced-metal bridging, reduction of process steps (e.g., those used in via patterning and formation), reduction of via-to-via leakage defects, improved time-dependent-dielectric breakdown (TDDB) performance of an interconnect of a semiconductor device, or an enhanced via resistance (Rc) yield window.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating an integrated circuit device, the method comprising:
   providing a substrate having an inter-layer dielectric (ILD) layer and an overlying capping layer formed thereon;
   forming a patterned hard mask layer on the capping layer and the ILD layer, wherein the patterned hard mask layer has a first opening defined by a first sidewall of the hard mask layer and a second sidewall of the hard mask layer;
   forming a layer overlying the patterned hard mask layer;
   patterning the layer to form a second opening, the second opening defined by a third sidewall of the layer and a fourth sidewall of the layer, wherein each of the first, second, third and fourth sidewalls are horizontally positioned at different points over the substrate;
   performing a first etch process, wherein the first etch includes etching the capping layer and the ILD layer, wherein the etch process includes forming a via hole in the ILD layer wherein a width of the via hole is defined by the third sidewall of the layer and the second sidewall of the patterned hard mask layer;
   performing a second etch process, after the first etch process, wherein the second etch process includes etching the patterned hard mask layer, using the patterned layer as a masking element, to form an etched hard mask layer, wherein the etching the patterned hard mask layer increases a width of the first opening in the patterned hard mask layer thereby providing a third opening, the third opening defined by the first sidewall and a fifth sidewall of the etched hard mask layer; and
   using the etched hard mask layer as a masking element to etch a fourth opening in the capping layer and a trench in the ILD layer, wherein the trench is contiguous with the via hole, wherein the fourth opening and the trench widths are defined by the first sidewall and the fifth sidewall of the etched hard mask layer.

2. The method of claim 1, wherein the trench and the via hole forms a dual-damascene profile opening in the ILD layer.

3. The method of claim 2, further comprising:
   filling the dual-damascene profile opening with a conductive material.

4. The method of claim 1, wherein the width of the via hole is from a fifth sidewall of the ILD layer to a sixth sidewall of the ILD layer, wherein the fifth sidewall of the ILD layer is collinear with the third sidewall of the layer, and wherein the sixth sidewall of the ILD layer is collinear with the second sidewall of the patterned hard mask layer.

5. The method of claim 1, wherein the layer includes an anti-reflective coating (ARC).

6. The method of claim 1, wherein each of the first, second, third and fourth sidewalls are horizontally positioned at different points over the substrate such that the second opening exposes a top surface of the patterned hard mask layer.

7. The method of claim 1, wherein each of the first, second, third and fourth sidewalls are horizontally positioned at different points over the substrate such that the layer fills a portion of the first opening of the patterned hard mask layer during the performing the etching process.

8. The method of claim 1, wherein the patterning the layer to form a second opening includes forming a photosensitive layer on the layer, patterning the photosensitive layer to form a masking element, and using the masking element to etch the second opening in the layer.

9. The method of claim 1, further comprising:
   forming an etch stop layer underlying the ILD layer, wherein using the etched hard mask layer the trench in the ILD layer further includes increasing a depth of the via hole to the etch stop layer.

10. A method of fabricating an integrated circuit device, the method comprising:
  providing a substrate, wherein the substrate includes a dielectric layer and a capping layer on the dielectric layer;
  forming a patterned hard mask layer on the capping layer wherein the patterned hard mask layer includes hard mask material having a first opening, wherein the first opening is defined by a first sidewall of hard mask material and an opposing second sidewall of hard mask material, wherein the first opening exposes a top surface of the capping layer;
  thereafter, forming an anti-reflective coating and a photosensitive layer over the anti-reflective coating on the patterned hard mask layer, wherein the anti-reflective coating is formed in the first opening in the hard mask layer such that an interface between the anti-reflective coating and exposed top surface of the capping layer is formed;
  patterning the photosensitive layer to provide an opening in the photosensitive layer;
  using the patterned photoresist layer to pattern the anti-reflective coating layer thereby providing a second opening in the anti-reflective coating layer, wherein the second opening is defined by a first sidewall of the anti-reflective coating layer and a second sidewall of the anti-reflective coating layer, wherein the second opening exposes a top surface of the hard mask layer;
  in a first etching process, etching the dielectric layer using the first sidewall of the anti-reflective coating layer and the second sidewall of the hard mask material as masking elements to form a via hole;
  in a second etch process subsequent to the first etch process, etching the patterned hard mask layer using the patterned anti-reflective coating layer to form an etched hard mask layer; and
  in a third etch process subsequent to the second etch process, using the etched hard mask layer to etch a trench in the dielectric layer, wherein the trench is coupled to the via hole.

11. The method of claim 10, further comprising:
  filling the trench and the via hole with conductive material.

12. The method of claim 10, wherein the first etch process has a time based endpoint.

13. The method of claim 10, wherein the etching the trench in the dielectric layer includes extending the depth of the via hole.

14. A method of semiconductor fabrication, comprising:
  providing a substrate having a dielectric layer, a capping layer, a hard mask layer, and a patterning layer formed thereon, wherein the patterning layer includes an anti-reflective coating material;
  patterning the hard mask layer to form a first sidewall and a second sidewall of the hard mask layer;
  patterning the patterning layer to form a first sidewall and a second sidewall of the patterning layer; and
  etching a via hole in the dielectric layer using the first sidewall of the hard mask layer and the second sidewall of the patterning layer to define a first and second sidewall of the via hole, and wherein the second sidewall of the hard mask layer and the first sidewall of the patterning layer are not used to define the first and second sidewall of the via hole;
  after etching the via hole, using the patterning layer as a masking element to perform a second patterning of the hard mask layer to define an opening defined by the second sidewall and a third sidewall of the hard mask layer; and
  thereafter, etching the capping layer and the dielectric layer using the second sidewall and the third sidewall of the hard mask layer to etch an opening in the capping layer and a trench contiguous with the via hole in the dielectric layer.

15. The method of claim 14, wherein the patterning the patterning layer includes depositing a photosensitive material, patterning the photosensitive material to form an opening in the photosensitive material, and using the opening to pattern the patterning layer.

16. The method of claim 14, wherein the substrate further includes an etch stop layer underlying the dielectric layer and wherein the etching the capping layer and the dielectric layer the trench contiguous with the via hole includes extending the via hole to the etch stop layer.

* * * * *